United States Patent
Song et al.

(10) Patent No.: US 10,998,118 B2
(45) Date of Patent: May 4, 2021

(54) PCB WINDING TRANSFORMER AND COIL BOARD THEREOF

(71) Applicant: Delta Electronics (Shanghai) Co., Ltd., Shanghai (CN)

(72) Inventors: Haibin Song, Shanghai (CN); Zengyi Lu, Shanghai (CN); Jinfa Zhang, Shanghai (CN); Shiwei Liu, Shanghai (CN); Jian Zhou, Shanghai (CN); Daofei Xu, Shanghai (CN); Jianwei Song, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 31 days.

(21) Appl. No.: 15/846,140

(22) Filed: Dec. 18, 2017

(65) Prior Publication Data

US 2018/0174737 A1   Jun. 21, 2018

(30) Foreign Application Priority Data

Dec. 19, 2016   (CN) .......................... 201621395261.9

(51) Int. Cl.
| | |
|---|---|
| *H01F 5/00* | (2006.01) |
| *H01F 27/28* | (2006.01) |
| *H05K 1/02* | (2006.01) |
| *H01F 27/24* | (2006.01) |
| *H05K 1/16* | (2006.01) |
| *H05K 1/11* | (2006.01) |
| *H01F 27/40* | (2006.01) |
| *H05K 3/46* | (2006.01) |

(52) U.S. Cl.
CPC ......... *H01F 27/2804* (2013.01); *H01F 27/24* (2013.01); *H05K 1/0298* (2013.01); *H05K 1/165* (2013.01); *H01F 2027/2819* (2013.01); *H01F 2027/408* (2013.01); *H05K 1/115* (2013.01); *H05K 3/46* (2013.01); *H05K 2201/086* (2013.01); *H05K 2201/09672* (2013.01)

(58) Field of Classification Search
USPC ......................................................... 336/200
See application file for complete search history.

(56) References Cited

U.S. PATENT DOCUMENTS

| | | | | |
|---|---|---|---|---|
| 5,642,276 | A * | 6/1997 | Lotfi | H01F 17/0006 257/E23.043 |
| 6,429,763 | B1 * | 8/2002 | Patel | H01F 27/2804 336/192 |
| 8,830,693 | B2 * | 9/2014 | Boone | A61N 1/3981 336/183 |

(Continued)

*Primary Examiner* — Ronald Hinson
(74) *Attorney, Agent, or Firm* — CKC & Partners Co., LLC

(57) ABSTRACT

The present disclosure discloses a PCB winding transformer and a coil board thereof. The PCB winding transformer comprises a coil board and a magnetic core. The coil board includes a primary coil and a secondary coil. The primary coil and the secondary coil are wound around a magnetic core column of the magnetic core. At least two via holes which correspond to the primary coil and the secondary coil respectively are disposed in the coil board. In the primary coil and the secondary coil, the via hole corresponding to the coil with less turns is disposed between an inner side of the coil with more turns and the magnetic core column.

9 Claims, 9 Drawing Sheets

(56) References Cited

U.S. PATENT DOCUMENTS

| | | | |
|---|---|---|---|
| 2009/0085702 A1* | 4/2009 | Zeng | H01F 27/292 336/107 |
| 2010/0117777 A1* | 5/2010 | Tan | H01F 27/2804 336/65 |
| 2011/0037405 A1* | 2/2011 | Suganuma | H01F 27/2804 315/276 |
| 2014/0266546 A1* | 9/2014 | Mao | H01F 41/046 336/200 |
| 2015/0155086 A1* | 6/2015 | Matsuura | H02M 3/28 363/17 |

* cited by examiner

PCB WINDING TRANSFORMER AND COIL BOARD THEREOF

CROSS-REFERENCE TO RELATED APPLICATIONS

This non-provisional application claims priority under 35 U.S.C. § 119(a) on Patent Application No. 201621395261.9 filed in P.R. China on Dec. 19, 2016, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present disclosure relates to a transformer, in particular to a PCB winding transformer and a coil board thereof.

BACKGROUND ART

Transformer design is always a key point for a switching mode power supply.

In recent years, with the increasing demand for higher power density, high frequency has become a development trend of the switching mode power supply, thus the design of the transformer becomes more important, since the leakage inductance of the transformer has more influence on the efficiency of the switching mode power supply with high frequency.

Compared with conventional winding type transformer, PCB winding transformer can usually achieve smaller size and less leakage inductance. The structure of the PCB winding transformer may still be further optimized to reduce leakage inductance, thus improve the efficiency of the switching mode power supply with high frequency.

SUMMARY

In order to overcome the problems in the prior art, the purpose of the present disclosure is to provide a PCB winding transformer. By optimizing the position of a via hole in a coil board of the PCB winding transformer, the size of the PCB winding transformer may be further reduced, and the size of a secondary loop or a primary loop may be reduced to make leakage inductance smaller.

In one aspect, the present disclosure provides a PCB winding transformer comprising a coil board and a magnetic core. The coil board comprises a primary coil and a secondary coil winding around a magnetic core column of the magnetic core. At least two via holes which correspond to the primary coil and the secondary coil respectively are disposed in the coil board. In the primary coil and the secondary coil, the via hole corresponding to the coil with less turns is disposed between an inner side of the coil with more turns and the magnetic core column.

In another aspect, the present disclosure provides a coil board comprising a primary coil and a secondary coil, the coil board including a through hole corresponding to a magnetic core column of a magnetic core. The primary coil and the secondary coil are wound around the magnetic core column. At least two via holes which correspond to the primary coil and the secondary coil respectively are disposed in the coil board. In the primary coil and the secondary coil, the via hole corresponding to the coil with less turns is disposed between an inner side of the coil with more turns and the through hole.

As compared with the prior art, the present disclosure may at least obtain the following beneficial technical effects. By positioning via hole corresponding to the coil with less turns between an inner side of the coil with more turns and the magnetic core column, the size of the loop formed by the coil with less turns may be reduced physically, thereby reducing the leakage inductance correspondingly. Additionally, the area of the coil board may be reduced.

DETAILED DESCRIPTION OF THE PREFERRED EMBODIMENT

Details and technical specification of the present disclosure are further described in combination with a preferred example, but shall not be construed as limit thereto.

Figure 1:
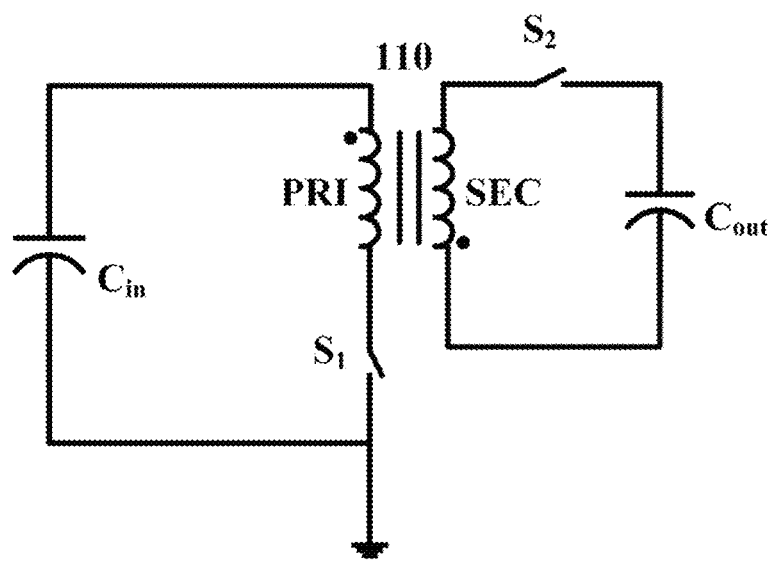
FIG. 1 is a circuit diagram of a flyback converter in the prior art.

An isolated switching mode power supply typically comprises a transformer, a primary power switch, an input bus capacitor, a secondary synchronous rectifier and an output capacitor. As shown in FIG. 1, by taking a flyback converter as an example, the flyback converter comprises a transformer 110, a primary power switch S1, an input bus capacitor Cin, a secondary synchronous rectifier S2, and an output capacitor Cout. The transformer 110 comprises a primary coil PRI and a secondary coil SEC. Generally, to design a conventional PCB winding transformer, only the impacts of layout of coils on leakage inductance may be taken into consideration. As a result, winding methods such as sandwich winding and interleave winding are developed to reduce the leakage inductance. However, the leakage inductance affecting efficiency of a switching mode power supply, includes not only the leakage inductance caused by insufficient coupling of the primary and secondary coil, but also including the leakage inductance from the primary loop and secondary loop, wherein the primary loop is formed by the input bus capacitor, the primary power switch and the primary coil, and the secondary loop is formed by the output capacitor, the secondary synchronous rectifier and the secondary coil.

Figure 2:
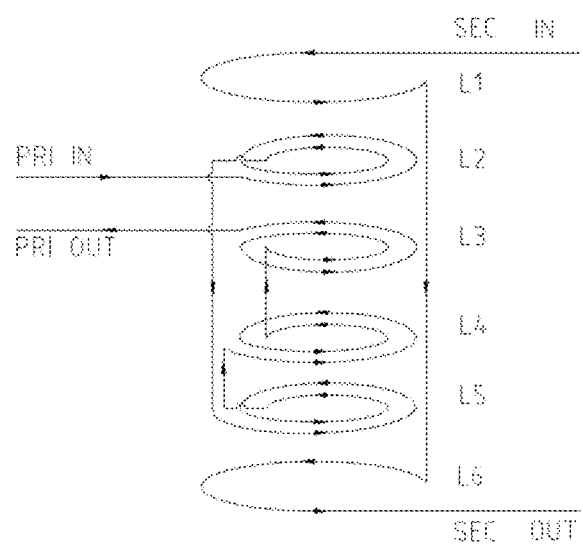
FIG. 2 is a schematic diagram of coils of a conventional PCB winding transformer.
Figure 3A:
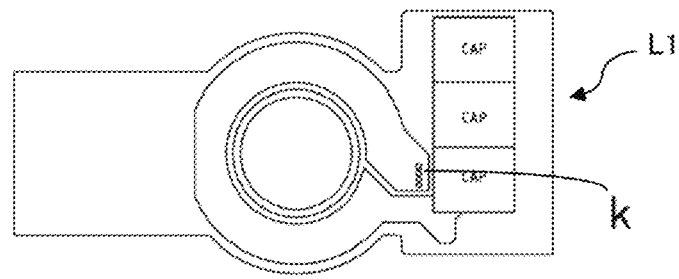
FIGS. 3A to 3F are layered diagrams of a coil board in the PCB winding transformer shown in FIG. 2.
Figure 3B:
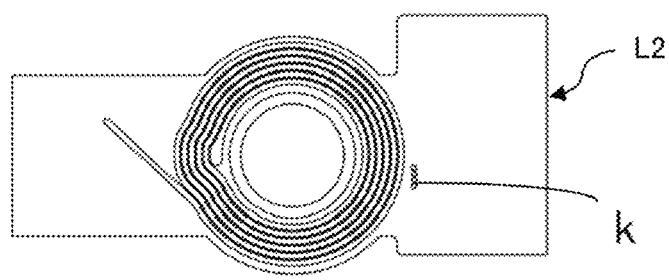
Figure 3C:
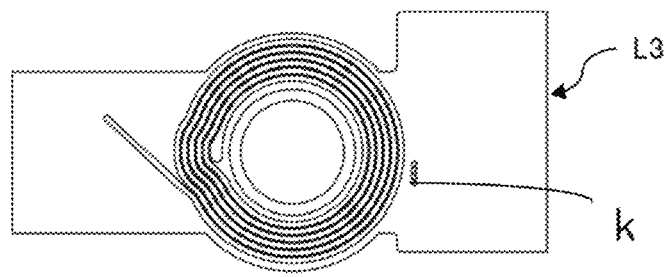
Figure 3D:
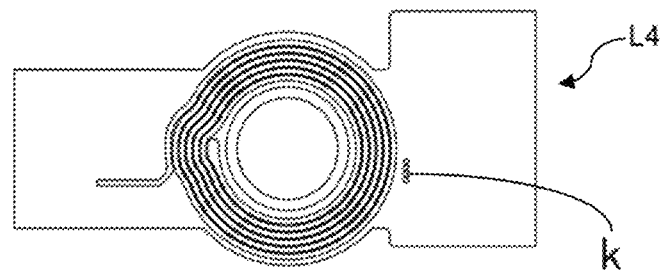
Figure 3E:
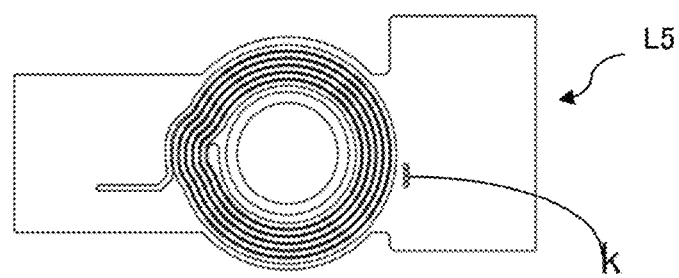
Figure 3F:
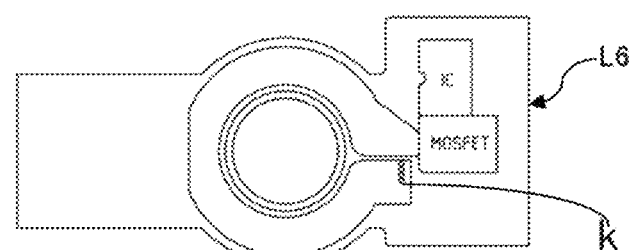

First, a summary description for a conventional PCB winding transformer will be provided below, with reference to FIG. 2 and FIGS. 3A-3F. FIG. 2 is a schematic diagram of coils of a conventional PCB winding transformer, and FIGS. 3A-3F are layered diagrams of a coil board in the conventional PCB winding transformer shown in FIG. 2. As shown in FIG. 2 and FIGS. 3A-3F, the coil board comprises a through hole corresponding to a magnetic core column of a magnetic core, a primary coil PM, and a secondary coil SEC. The primary coil PRI and the secondary coil SEC are wound around the magnetic core column. Via hole k corresponding to the secondary coil SEC is located at an outer side of the primary coil PM. In the above structure, both the magnetic core and a secondary synchronous rectifier serve as secondary elements. Due to the via hole k for connecting respective layers of the coil SEC, the secondary synchronous rectifier could not get further closer to the magnetic core. With the above structure, the area of the PCB could not be further reduced so as to reduce the size of the switching mode power supply. Further, the size of the secondary loop could not be further reduced so as to reduce leakage inductance of the transformer. On another aspect, as to a PCB winding transformer having a primary coil PRI located in the first layer and the last layer, the PCB winding transformer may suffer from the same problems above, detailed description is omitted here.

Figure 4A:
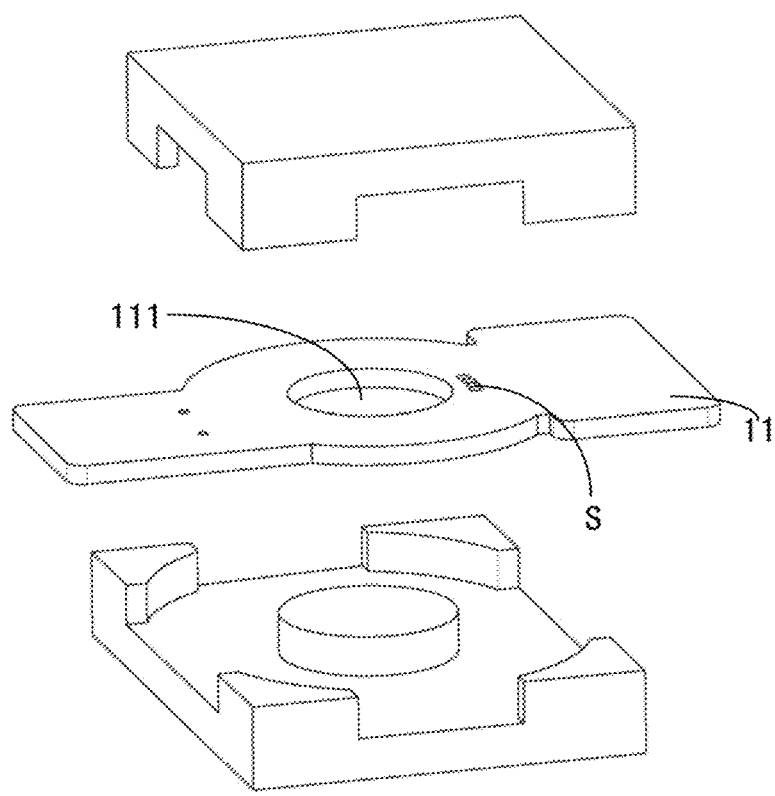
FIG. 4A is an exploded view of a PCB winding transformer according to one embodiment of the present disclosure.
Figure 4B:
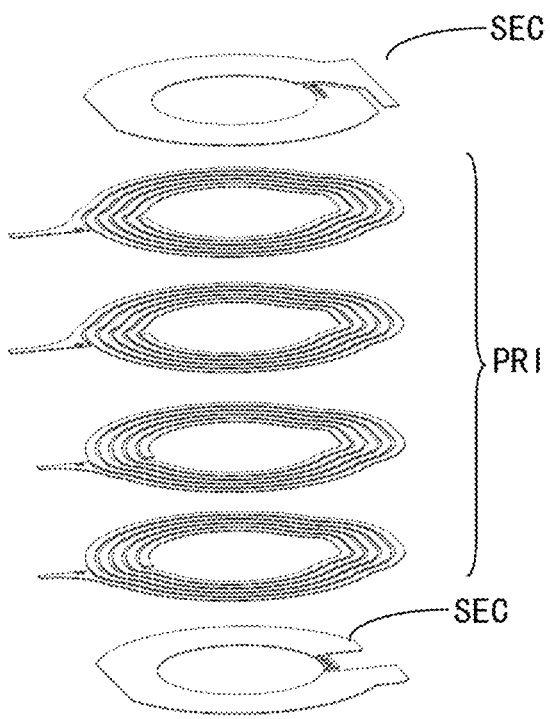
FIG. 4B is an exploded view of coils of the PCB winding transformer shown in FIG. 4A.
Figure 5:
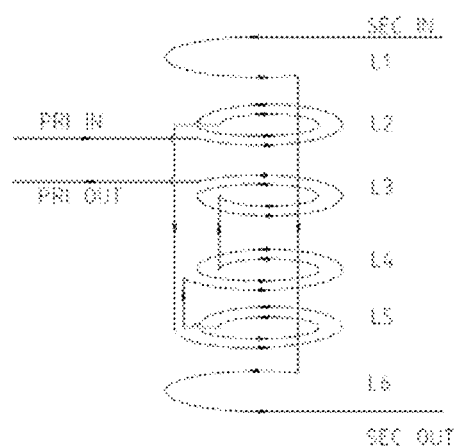
FIG. 5 is a schematic diagram of coils in the PCB winding transformer shown in FIG. 4A.
Figure 6A:
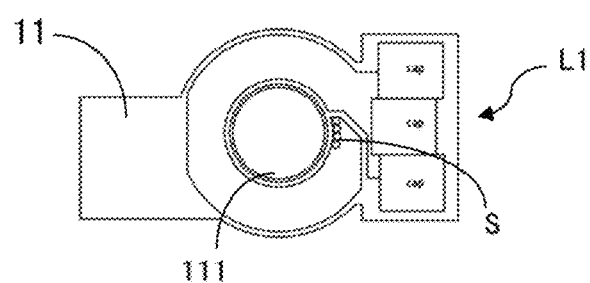
FIGS. 6A-6G are layered diagrams of a coil board in the PCB winding transformer shown in FIG. 4A.
Figure 6B:
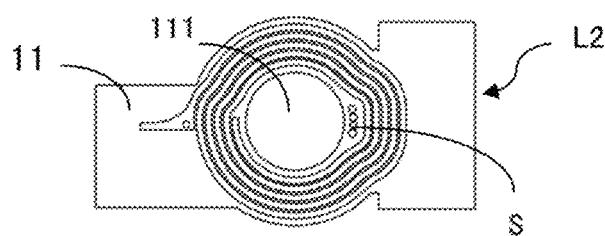
Figure 6C:
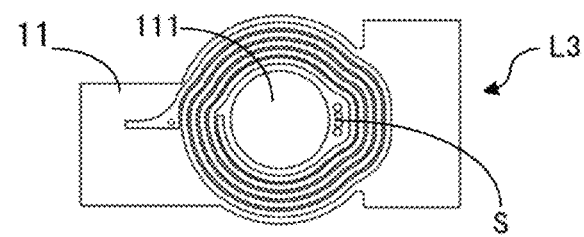
Figure 6D:
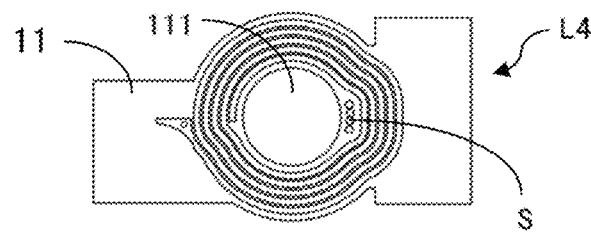
Figure 6E:
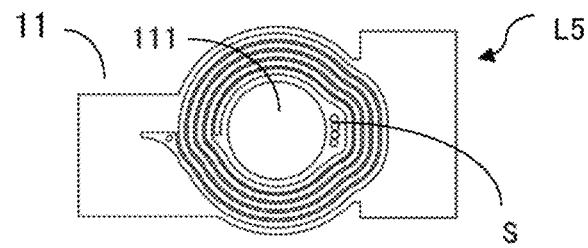
Figure 6F:
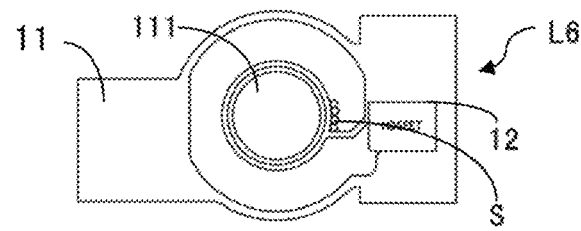
Figure 6G:
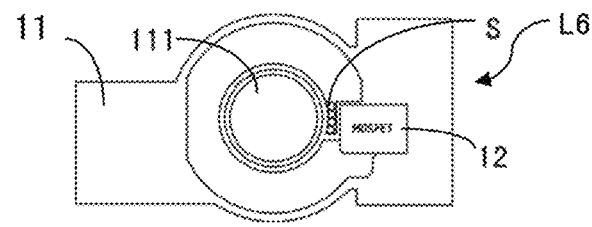
Figure 7:
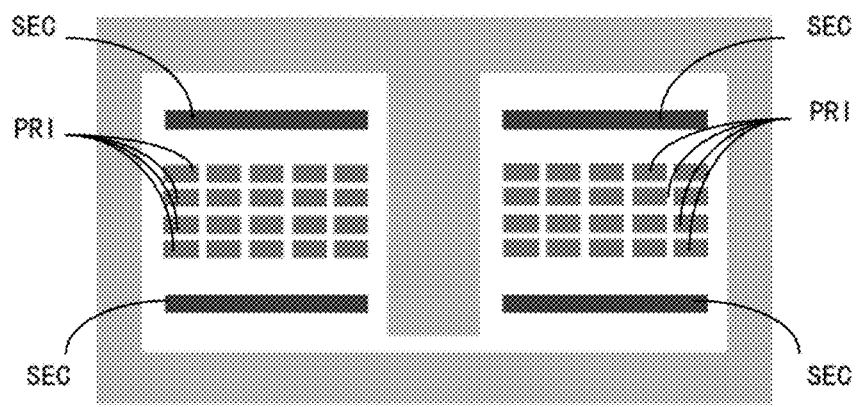
FIG. 7 is a structural diagram of the coils shown in FIG. 5.

A PCB winding transformer according to one embodiment of the present disclosure will be described below with reference to FIG. 4A to FIG. 7. FIG. 4A is an exploded view of a PCB winding transformer according to one embodiment of the present disclosure; FIG. 4B is an exploded view of coils of the PCB winding transformer shown in FIG. 4A; FIG. 5 is a schematic diagram of coils in the PCB winding transformer shown in FIG. 4A; FIGS. 6A-6G are layered diagrams of a coil board in the PCB winding transformer shown in FIG. 4A; FIG. 7 is a structural diagram of the coils shown in FIG. 5. As shown in FIG. 4A to FIGS. 6A-6G, the PCB winding transformer according to the present disclosure comprises a coil board 11 and a magnetic core. The coil board 11 comprises a primary coil PM and a secondary coil SEC. The primary coil PM and the secondary coil SEC are disposed in the coil board 11. The magnetic core is provided with a magnetic core column. The primary coil PRI and the secondary coil SEC are wound around the magnetic core column. At least two via holes which correspond to the primary coil PM and the secondary coil SEC respectively are provided in the coil board 11. A through hole 111 corresponding to the magnetic core column is also provided in the coil board 11. In one embodiment, the magnetic core may be provided with a plurality of magnetic core columns. In such a case, a pair of primary coil and secondary coil may be wound around each of the plurality of magnetic core columns respectively. However, the present disclosure is not limited thereto.

As shown in FIG. 5, the secondary coil SEC is located in the first layer and the last layer, and the primary coil PRI is located in the intermediate layers. The number of turns of the secondary coil SEC is less than that of the primary coil PM. FIG. 5 is only used to illustrate the fact that the number of turns of the secondary coil SEC is less than that of the primary coil PM, and does not limit the actual number of turns of the coils. Further, referring to the layered diagrams of the coil board shown in FIGS. 6A-6G, the coil board 11 includes a multilayer structure. In this multilayer structure, the secondary coil SEC is located in the first layer L1 and the last layer L6; the primary coil PRI is located in the intermediate layers L2 to L5; and the via hole S is disposed between an inner side of the primary coil PRI and the through hole 111, for connecting respective layers of the secondary coil SEC. In this way, the size of the coil board may be reduced to make the size of the switching mode power supply smaller.

Further, on the coil board, a secondary synchronous rectifier 12 is provided. The secondary synchronous rectifier 12 may be located closer to the secondary coil SEC. For example, as shown in FIG. 6F, the secondary synchronous rectifier 12 is disposed at one side of the secondary coil SEC, and may get closer to the magnetic core to reduce the secondary loop, which is formed by the output capacitor Cout, the secondary synchronous rectifier 12 and the secondary coil SEC, thereby reducing leakage inductance caused by the secondary loop. Thus the efficiency of the switching mode power supply is improved and the size of the switching powers supply is further reduced. However, the present disclosure is not limited thereto. Alternatively, the secondary synchronous rectifier 12 may be disposed directly on the secondary coil SEC, as shown in FIG. 6G, to further reduce the secondary loop, thereby further reducing the leakage inductance. Depending on the applications, circuit topologies, or the like, other secondary power elements may be further provided in the PCB winding transformer. However, the present disclosure is not limited thereto. For example, the secondary synchronous rectifier 12 shown in FIG. 6 may be replaced with a secondary rectifier diode.

A structural diagram of the coils shown in FIG. 5 will be described with reference to FIG. 7. In this structure, the primary coil PRI is formed in 20 turns and the secondary coil SEC is formed in 2 turns, which are designed in a 6-layer coil board structure. The secondary coil SEC is disposed in the first layer and the sixth layer, with one turn in each layer. The respective layers of the secondary coil SEC are connected in series through the corresponding via hole S. The primary coil PM is disposed in the second layer to the fifth layer, with five turns in each layer. The respective layers of the primary coil PM are connected in series through other via holes corresponding to the primary coil PRI.

Although the via hole S in the above embodiment is designed for the secondary coil SEC, the present disclosure is not limited thereto. According to the characteristics that the loop impacts on the leakage inductance, the less turns of coil the primary or secondary loop has, the greater the primary or secondary loop impacts on the leakage inductance. Therefore, by moving the via hole corresponding to the coil with less turns to a position between the inner side of the other coil with more turns and the magnetic core column (or the through hole), the size of the loop which has less turns may be physically reduced, which in turn reduces the leakage inductance. Specifically, in the above embodiment, the size of the secondary loop may be physically reduced by moving the via hole S corresponding to the secondary coil SEC to a position between the inner side of the primary coil PRI and the magnetic core column (or the through hole), thereby reducing leakage inductance.

Figure 8:
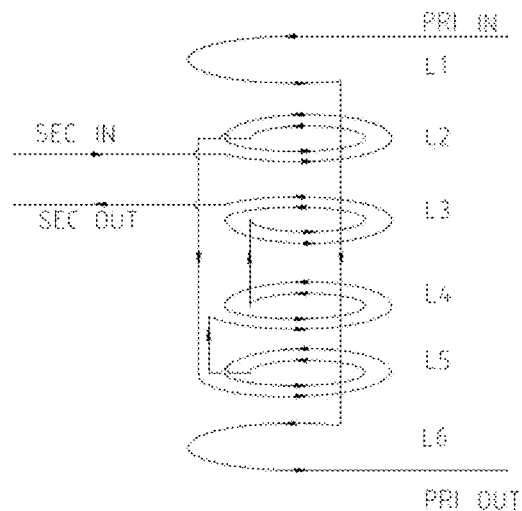
FIG. 8 is a schematic diagram of coils in a PCB winding transformer according to another embodiment of the present disclosure.

A PCB winding transformer according to another embodiment of the present disclosure will be described below with reference to FIG. 8 and FIGS. 9A to 9G. FIG. 8 is a schematic diagram of coils in a PCB winding transformer according to another embodiment of the present disclosure; and FIGS. 9A through 9G are layered diagrams of a coil board in the PCB winding transformer of FIG. 8. The structure of the PCB winding transformer shown in FIG. 8 and FIGS. 9A to 9G is substantially the same as the structure of the PCB winding transformer shown in FIG. 5 and FIGS. 6A to 6G, and the layered structure of the coils is substantially the same as that in FIGS. 6A to 6G. Therefore, only differences therebetween are described here. The coil board 11' shown in FIG. 8 and FIGS. 9A to 9G comprises a primary coil PM and a secondary coil SEC. The coil board 11' includes a multilayer structure, wherein the number of turns of the primary coil PM is less than that of the secondary coil SEC. The primary coil PRI is located in the first layer and the last layer. The secondary coil SEC is located in the intermediate layers. Respective layers of the primary coil PM are connected through the via hole S' corresponding to the primary coil PRI. The coil board 11' is also provided with a through hole 111' corresponding to a magnetic core column of a magnetic core. The via hole S' are disposed between an inner side of the secondary coil SEC and the through hole 111' so as to reduce the size of the coil board 11'.

Figure 9A:
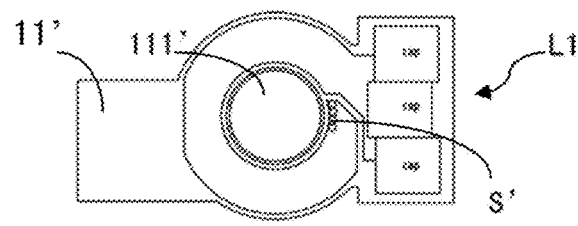
FIGS. 9A through 9G are layered diagrams of a coil board in the PCB winding transformer shown in FIG. 8.
Figure 9B:
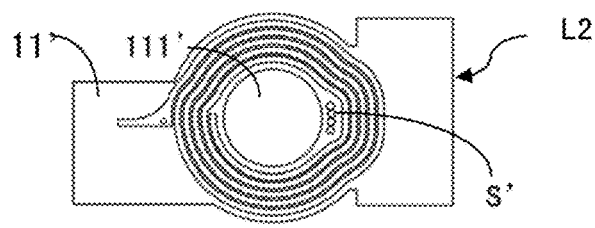
Figure 9C:
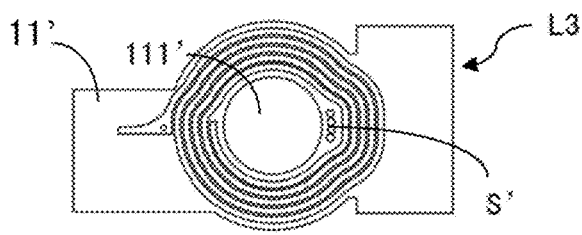
Figure 9D:
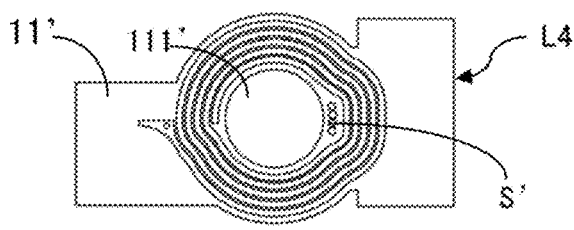
Figure 9E:
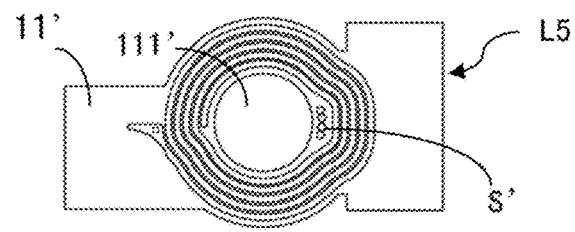
Figure 9F:
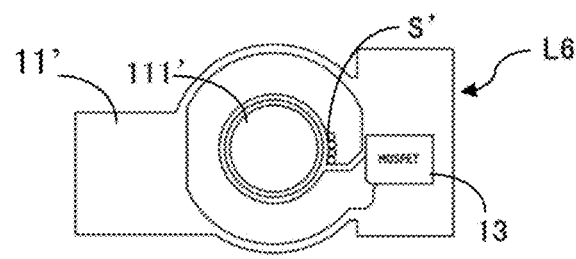
Figure 9G:
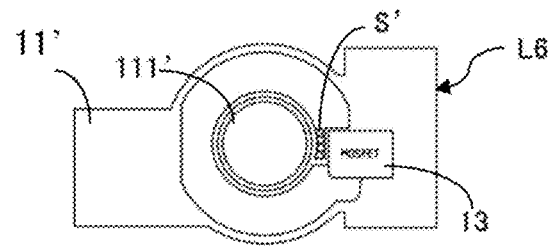

Different from the embodiment shown in FIG. 5 and FIGS. 6A to 6G, on the coil board of the PCB winding transformer shown in FIG. 8 and FIGS. 9A to 9G, a primary power switch 13 is provided. The primary power switch 13 may be located closer to the primary coil PM. As shown in FIG. 9F, the primary power switch 13 is disposed at one side of the primary coil PM, and the primary power switch 13 may get closer to the magnetic core to reduce the primary loop, which is formed by the input bus capacitor Cin, the primary power switch 13 and the primary coil PRI, thereby reducing the leakage inductance caused by the primary loop. Thus the efficiency of the switching mode power supply is also improved and the size of the switching powers supply is further reduced. However, the present disclosure is not limited thereto. Alternatively, the primary power switch 13 may be disposed directly on the primary coil PM, as shown in FIG. 9G, to further reduce the primary loop, thereby further reducing leakage inductance caused by the primary loop.

It should be noted that the example is only used to explain the present disclosure, but not used to limit the technical solutions of the present disclosure. In addition, although the present disclosure is described in detail in combination with the example, it should be understood by those of ordinary skill in the art that modification or equivalent replacement may be made to the present disclosure. Therefore, all technical solutions and improvement thereof without departing from the spirit and scope of the present disclosure shall be incorporated in the protection scope of the claims of the present disclosure.

What is claimed is:

1. A PCB winding transformer, comprising a magnetic core and a coil board,
   wherein the coil board comprises a primary coil and a secondary coil winding around a magnetic core column of the magnetic core and being arranged in a multilayer structure, with the secondary coil comprising two turns, one turn of the secondary coil located in a first layer and the other turn of the secondary coil located in a last layer, and the primary coil comprising more turns than the secondary coil being located in intermediate layers,
   wherein at least one via hole for connecting respective layers of the secondary coil are disposed in the coil board, and
   wherein in a plane in which the primary coil is located, the at least one via hole for connecting respective layers of the secondary coil is disposed between an inner side of the primary coil and the magnetic core column,
   the PCB winding transformer further comprises a switching device disposed on and at least partly overlapped with the secondary coil.

2. The PCB winding transformer according to claim 1, wherein the switching device is a secondary synchronous rectifier disposed on the secondary coil.

3. The PCB winding transformer according to claim 1, wherein the switching device is a secondary rectifier diode disposed on the secondary coil.

4. The PCB winding transformer according to claim 1, wherein the switching device is a primary power switch disposed on the primary coil.

5. The PCB winding transformer according to claim 1, wherein the PCB winding transformer is used in a flyback converter.

6. A coil board, comprising a primary coil, a secondary coil and a through hole corresponding to a magnetic core column of a magnetic core,
   wherein the primary coil and the secondary coil are wound around the magnetic core column and being arranged in a multilayer structure, with the secondary coil comprising two turns, one turn of the secondary coil located in a first layer and the other turn of the secondary coil located in a last layer, and the primary coil comprising more turns than the secondary coil being located in intermediate layers,
   wherein at least one via hole for connecting respective layers of the secondary coil are disposed in the coil board,
   wherein in a plane in which the primary coil is located, the at least one via hole for connecting respective layers of the secondary coil is disposed between an inner side of the primary coil and the through hole, and
   wherein a switching device is disposed on and at least partly overlapped with the secondary coil.

7. The coil board according to claim 6, wherein the switching device is a secondary synchronous rectifier disposed on the secondary coil.

8. The coil board according to claim 6, wherein the switching device is a secondary rectifier diode disposed on the secondary coil.

9. The coil board according to claim 6, wherein the switching device is a primary power switch disposed on the primary coil.

* * * * *